United States Patent
Lee

(10) Patent No.: US 7,368,963 B2
(45) Date of Patent: May 6, 2008

(54) DELAY LOCKED LOOP FOR USE IN SEMICONDUCTOR MEMORY DEVICE AND METHOD THEREOF

(75) Inventor: Hyun-Woo Lee, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 31 days.

(21) Appl. No.: 11/144,474

(22) Filed: Jun. 2, 2005

(65) Prior Publication Data
US 2006/0132203 A1    Jun. 22, 2006

(30) Foreign Application Priority Data
Dec. 20, 2004    (KR)    ........................ 10-2004-0108542

(51) Int. Cl.
*H03L 7/06*    (2006.01)
(52) U.S. Cl. .................. 327/158; 327/149; 327/161; 327/163; 331/25; 365/233
(58) Field of Classification Search ................ 327/149, 327/153, 158, 161–163, 3, 7; 331/1 A, 17, 331/25, 1 R; 375/373–376; 365/233
See application file for complete search history.

(56) References Cited

U.S. PATENT DOCUMENTS

| | | | | |
|---|---|---|---|---|
| 5,764,584 A | * | 6/1998 | Fukiage et al. | 365/230.03 |
| 6,094,080 A | * | 7/2000 | Jeong et al. | 327/176 |
| 6,100,736 A | * | 8/2000 | Wu et al. | 327/159 |
| 7,027,352 B2 | * | 4/2006 | Jung | 365/233 |
| 7,046,042 B1 | * | 5/2006 | Dino et al. | 327/3 |

FOREIGN PATENT DOCUMENTS

| | | |
|---|---|---|
| KR | 10-0224718 | 7/1999 |
| KR | 2003-0078129 | 10/2003 |

* cited by examiner

*Primary Examiner*—Kenneth B. Wells
*Assistant Examiner*—William Hernandez
(74) *Attorney, Agent, or Firm*—Blakely, Sokoloff, Taylor & Zafman

(57) ABSTRACT

A delay locked loop (DLL) for generating a delay locked clock signal includes a delay line unit for delaying an external clock signal according to a delay amount control signal to thereby generate the delay locked clock signal; a divider for dividing the delay locked clock signal by a predetermined number determined based on a column address strobe (CAS) latency to thereby generate a divided signal; and a delay line control unit for generating the delay amount control signal based on a result of comparing a phase of the external clock signal and a delayed signal of the divided signal.

23 Claims, 5 Drawing Sheets

DELAY LOCKED LOOP FOR USE IN SEMICONDUCTOR MEMORY DEVICE AND METHOD THEREOF

FIELD OF INVENTION

The present invention relates to a delay locked loop (DLL); and, more particularly, to a DLL which is suitable for a high-speed system.

DESCRIPTION OF PRIOR ART

Generally, in an electronic circuit system such as a computer system, a clock signal is used as a reference signal for controlling timings of performing various operations. However, when an external clock signal inputted to a semiconductor memory device is converted into an internal clock signal of the semiconductor memory device, a clock skew between the external clock signal and the internal clock signal is generated. Due to the clock skew, the data cannot be synchronized with the external clock signal when data are outputted from the semiconductor memory device. Therefore, a delay locked loop (DLL) is employed in the semiconductor memory device for solving the above-mentioned problem.

FIG. 1 is a block diagram showing a conventional DLL.

As shown, the conventional DLL includes an input buffer 111, a delay line 112, a shift register 115, a phase comparator 114, a delay model 113 and an output buffer 116.

The clock buffer 111 buffers an external clock signal CLK and an inverted version of the external clock signal CLK, i.e., an external clock bar signal /CLK to generate an internal clock signal ICLK. The delay line 114 receives the internal clock signal ICLK to generate a delayed internal clock signal by delaying the internal clock signal ICLK. The output buffer 116 buffers the delayed internal clock signal to thereby generate a delay locked clock signal DLL_CLK.

The phase detector 114 compares a phase of the internal clock signal ICLK with a phase of a feed-backed clock signal fb_clk outputted from the delay model 113 to thereby generate a first delay control signal UP and a second delay control signal DN based on the comparison result.

The delay model 113 delays the delayed internal clock signal for a predetermined delay time in order to compensate a delay time. Herein, the delay time to be compensated includes a first delay time generated when the external clock signal CLK and the external clock bar signal /CLK are passed through the input buffer 111, a second delay time generated when the delayed internal clock signal is passed through the output buffer 116 and a flight time generated when a data is passed through a data output pad (DQ pad) after the data is synchronized with the delay locked clock signal DLL_CLK.

The shifter register 115 controls a delay amount of the delay line 112 based on the first delay control signal UP and the second delay control signal DN.

Herein, as above-mentioned, the delay model 113 models a delay amount which corresponds to the delay time to be compensated. However, a fan-out, i.e., an amount of a driving load of the delay model 113, is increased as an operational frequency is increased. Therefore, when the conventional DLL is operated at a high operational frequency, it is difficult to secure characteristics of a signal passed through the delay model 113. For solving the above-mentioned problem, a method of dividing a clock signal has been developed to thereby reduce a frequency of a signal inputted to a delay model.

FIG. 2 is a block diagram showing another conventional DLL which employs the above-mentioned clock dividing method.

As shown, the conventional DLL includes a first clock buffer 211, a second clock buffer 212, a clock divider 213, a first delay line 214, a second delay line 215, a third delay line 216, a phase comparator 218, a shift controller 219, a shift register 220, a first DLL driver 221, a second DLL driver 222 and a delay model 217.

The first clock buffer 211 buffers an external clock bar signal /CLK to generate a falling edge clock signal fclk synchronized with a falling edge of an external clock signal CLK. The second clock buffer 212 buffers the external clock signal CLK to generate a rising edge clock signal rclk synchronized with a rising edge of the external clock signal rclk.

The first delay line 214 delays the falling edge clock signal fclk according to a delay amount control signal to thereby generate a delayed falling edge clock signal ifclk. Likewise, the second delay line 215 delays the rising edge clock signal rclk according to the delay amount control signal to thereby generate a delayed rising edge clock signal irclk.

The first and the second DLL drivers 221 and 222 respectively receive the delayed falling edge clock signal ifclk and the delayed rising edge clock signal irclk to thereby generate a delay locked falling edge clock signal fclk and a delay locked rising edge clock signal rclk.

The clock divider 213 divides the rising edge clock signal rclk by N to thereby generate a delay monitoring clock signal dly_in and a reference clock signal ref, where N is a natural number (generally 8).

The third delay line 216 delays the delay monitoring clock signal dly_in based on the delay amount control signal to thereby generate a delayed delay monitoring clock signal feedback_dly. The delay model 217 delays the delayed delay monitoring clock signal feedback_dly for a predetermined delay time to thereby generate a feed-backed clock signal fb_clk. A role of the delay model 217 is same to that of the delay model 113 of the conventional DLL shown in FIG. 1.

The phase comparator 218 compares a phase of the reference clock signal ref with a phase of the feed-backed clock signal fb_clk to thereby generate a control signal ctrl based on a result of the comparison. According to the control signal ctrl, the shift controller 219 generates a shift right control signal SR and a shift left control signal SL. Herein, the shift controller 219 also generates a delay locking signal dll_lockb when a delay locking operation of the conventional DLL is completed.

The shift register 220 generates the delay amount control signal for controlling delay amounts of the first to the third delay lines 214 to 216 based on the shift right control signal SR and the shift left control signal SL.

As described above, the conventional DLL is more suitable than the conventional DLL shown in FIG. 1 at a high operation frequency. However, even though the conventional DLL is suitable at the high operational frequency, a size of the conventional DLL is increased due to the additional delay line, i.e., the third delay line 216. Accordingly, a power consumption of the conventional DLL is also increased.

Further, the divider included in the conventional DLL cannot change a dividing number, i.e., the divider divides a clock signal by a constant number. Therefore, it is not possible to change the constant number according to a variation of the operational frequency. For instance, at an operational frequency of 1 GHz, the divider divides a clock signal by 2 on the assumption that the constant number is 2. If the operational frequency is changed to 2 GHz, it is preferable to divide the clock signal by a larger number, e.g., 4. However, the conventional DLL cannot divide the clock signal by 4 since the dividing number is fixed to 2. Therefore, the conventional DLL may not be stably operated when the operational frequency is increased.

Furthermore, even though the operational frequency is so low that the clock signal is not needed to be divided, the conventional DLL divides the clock signal by the constant number. Accordingly, a delay line length should be more increased for this case.

SUMMARY OF INVENTION

It is, therefore, an object of the present invention to provide a delay locked loop (DLL), which is stably operated at a high operational frequency, for reducing a power consumption and a circuit size.

In accordance with an aspect of the present invention, there is provided a delay locked loop (DLL) for generating a delay locked clock signal, including a delay line unit for delaying an external clock signal according to a delay amount control signal to thereby generate the delay locked clock signal; a divider for dividing the delay locked clock signal by a predetermined number determined based on a column address strobe (CAS) latency to thereby generate a divided signal; and a delay line control unit for generating the delay amount control signal based on a result of comparing a phase of the external clock signal and a delayed signal of the divided signal.

In accordance with another aspect of the present invention, there is provided a DLL for use in a semiconductor memory device, including a delay line unit for delaying an external clock signal or an external clock bar signal according to a delay amount control signal to thereby generate the delay locked clock signal; a divider for dividing the delay locked clock signal by a predetermined number determined based on a column address strobe (CAS) latency to thereby generate a divided signal; a delay line control unit for generating the delay amount control signal based on a result of comparing a phase of the external clock signal and a delayed signal of the divided signal; and a multiplexing unit for inputting one of the external clock signal and the external clock bar signal to the delay line unit based on the delay amount control signal and the result of comparing.

In accordance with further another aspect of the present invention, there is provided a semiconductor memory device for generating a delay locked clock signal, including a buffering unit for buffering an external clock signal and an external clock bar signal to thereby generate a rising edge clock signal and a falling edge clock signal respectively; a delay line unit for delaying the rising edge clock signal or the falling edge clock signal according to a delay amount control signal to thereby generate the delay locked clock signal; a divider for dividing the delay locked clock signal by a predetermined number determined based on a column address strobe (CAS) latency to thereby generate a divided signal; a phase comparator for comparing the phase of the rising edge clock signal and the phase of a delayed signal of the divided signal to thereby generate a delay increment control signal and a delay decrement control signal based on a result of the comparison; a shift register for generating the delay amount control signal based on the delay increment control signal and the delay decrement control signal; and a multiplexing unit for inputting one of rising edge clock signal and the falling edge clock signal to the delay line unit based on the delay amount control signal and the result of the comparison.

In accordance with further another aspect of the present invention, there is provided a clock locking method of a delay locked loop (DLL) for a clock locking operation, including the steps of a) delaying an input clock signal according to a delay amount control signal to thereby generate a delay locked clock signal; b) dividing the delay locked clock signal according to a column address strobe (CAS) latency to thereby generate a divided signal; and c) generating the delay amount control signal based on a result of comparing a phase of the input clock signal and a delayed signal of the divided signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a delay locked loop (DLL) in accordance with the present invention will be described in detail referring to the accompanying drawings.

In accordance with the present invention, a clock signal is divided according to a column address strobe (CAS) latency. Since the CAS latency is increased as an operational frequency is increased and the CAS latency is decreased as the operational frequency is decreased, the clock signal can be divided by an appropriate number according to the operational frequency.

Figure 1:
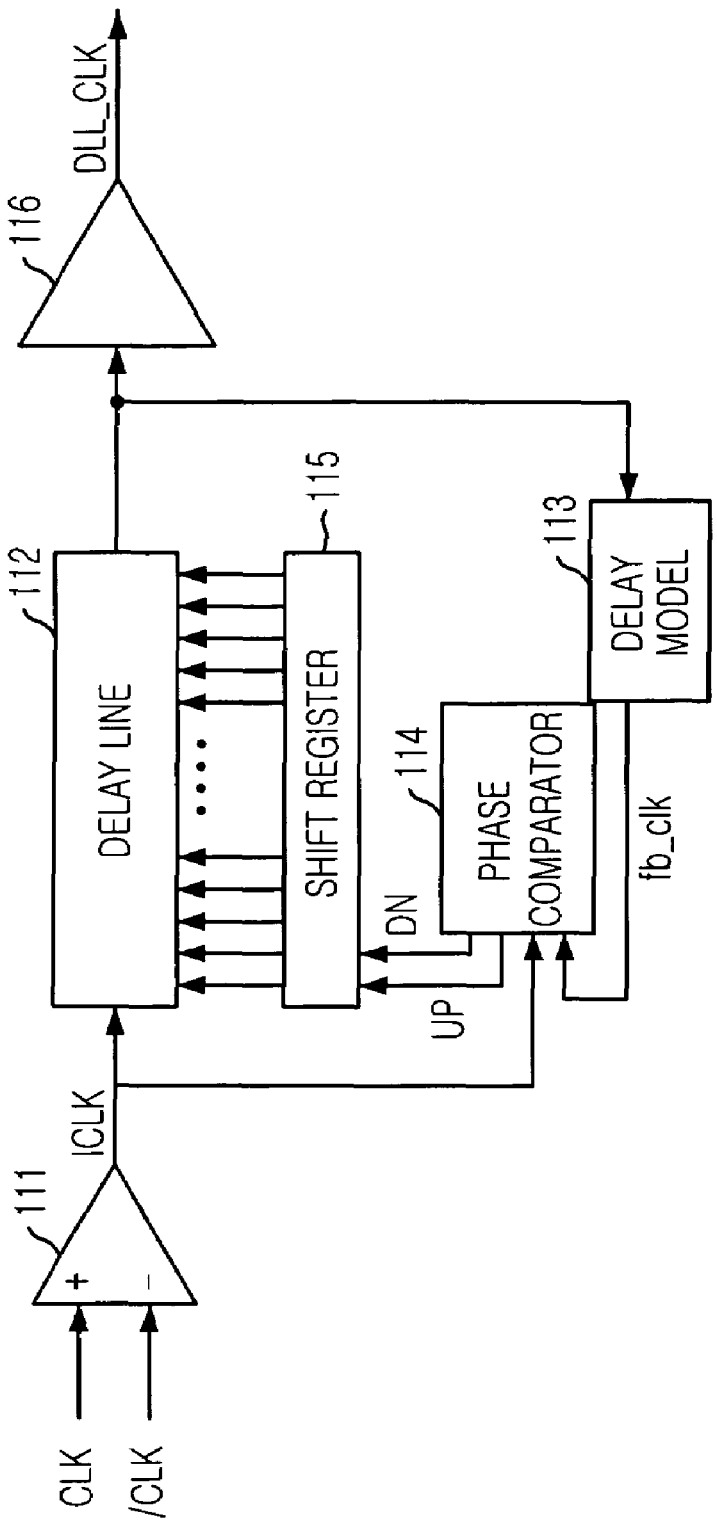
FIG. 1 is a block diagram showing a first conventional DLL.
Figure 2:
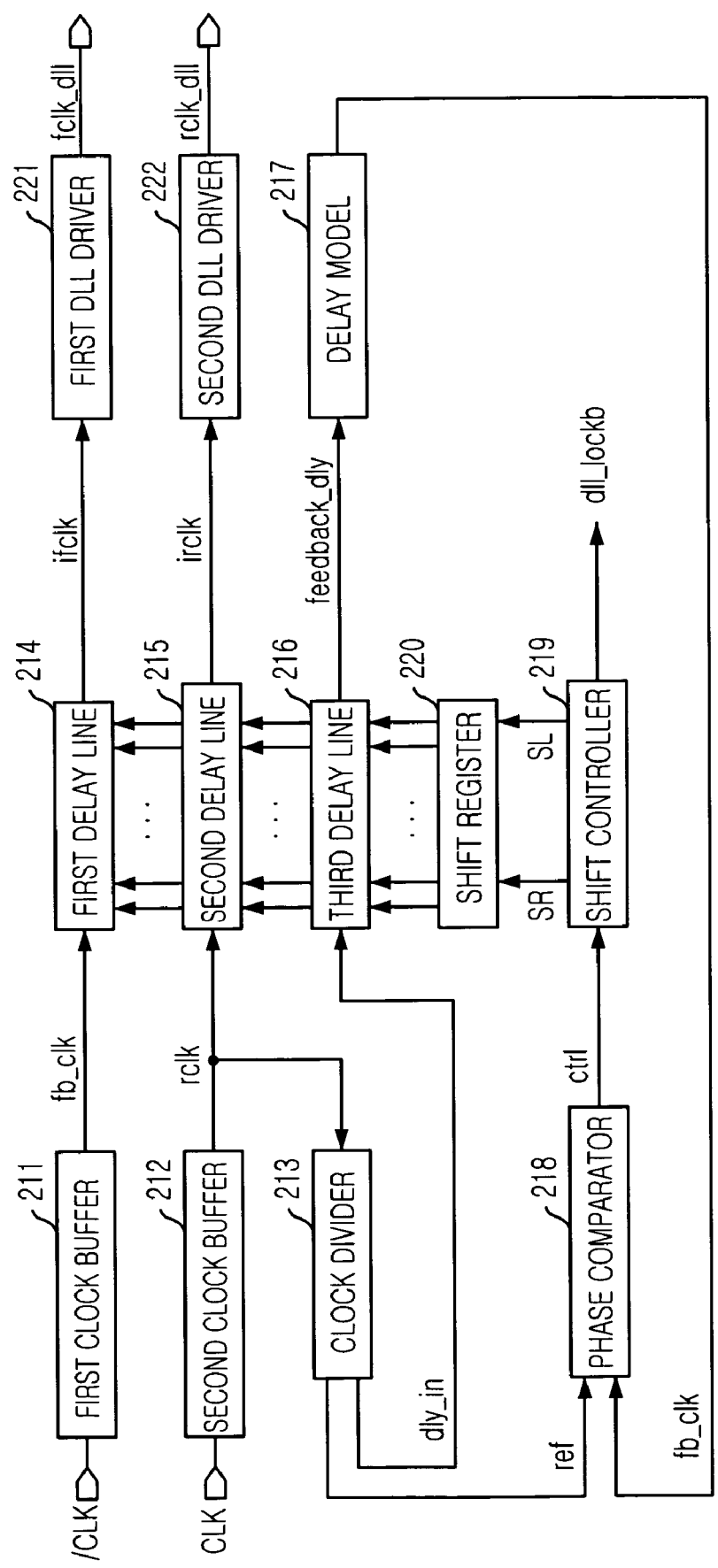
FIG. 2 is a block diagram showing a second conventional DLL.
Figure 3:
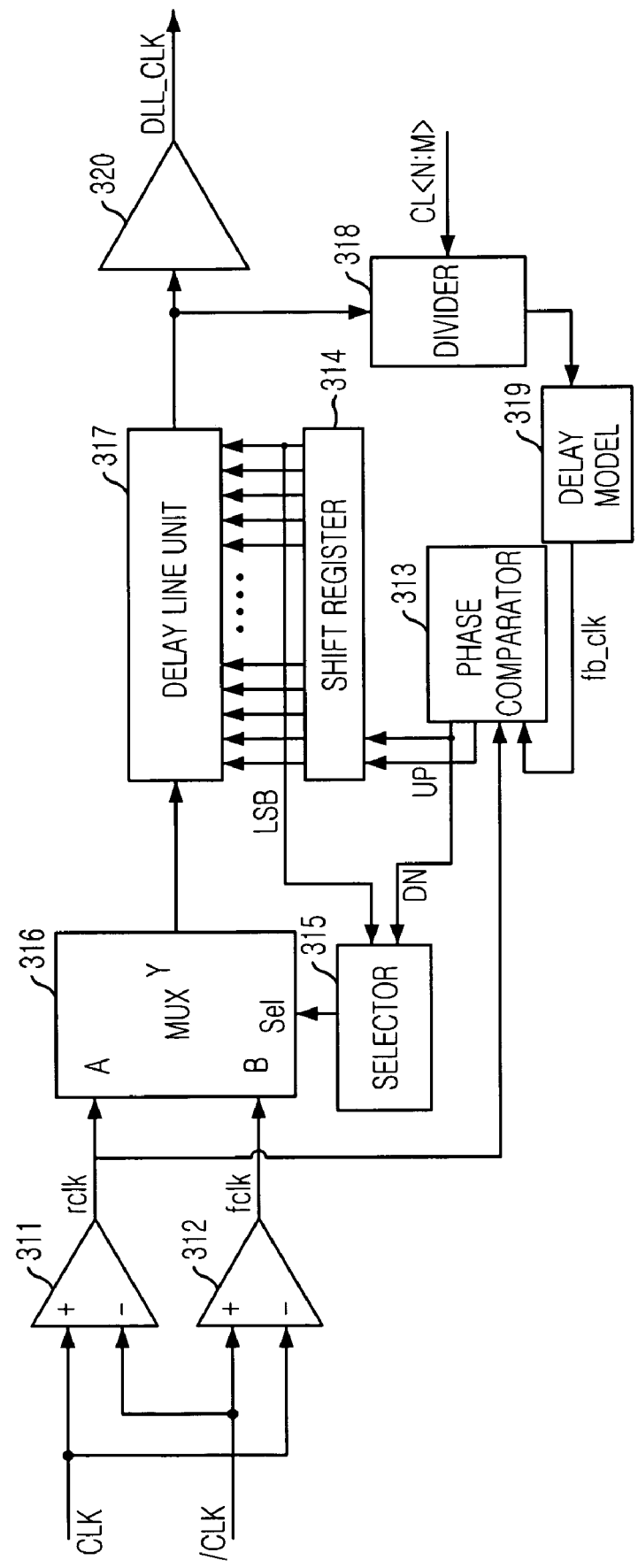
FIG. 3 is a block diagram showing a DLL in accordance with a first embodiment of the present invention.

FIG. 3 is a block diagram showing a DLL in accordance with a first embodiment of the present invention.

As shown, the DLL includes a first input buffer 311, a second input buffer 312, a multiplexer 316, a multiplexer controller 315, a delay line unit 317, a shift register 314, a phase comparator 313, a divider 318, a delay model 319 and an output buffer 320.

The first input buffer 311 buffers an external clock signal CLK to generate a rising edge clock signal rclk. A rising edge of the rising edge clock signal rclk corresponds to a rising edge of the external clock signal CLK. Similarly, the second input buffer 312 buffers an inverted version of the external clock signal CLK, i.e., an external clock bar signal /CLK, to generate a falling edge clock signal fclk. A rising edge of the falling edge clock signal fclk corresponds to a falling edge of the external clock signal CLK.

The multiplexer 316 selects one of the rising edge clock signal rclk and the falling edge clock signal fclk based on a selection signal outputted from the multiplexer controller 315.

The delay line unit 317 delays an output of the multiplexer 316 according to a delay amount control signal outputted from the shift register 314 to thereby generate a delayed clock signal. The output buffer 320 buffers the delayed clock signal to thereby generate a delay locked clock signal DLL_CLK.

The divider 318 divides the delayed clock signal based on a column address strobe (CAS) latency signal CL<N:M>. Since the CAS latency varies according to an operational frequency, the divider 318 can divide the delayed clock signal according to the operational frequency. That is, the divider 318 divides the delayed clock signal by a larger number when the operational frequency is increased. When the operational frequency is so low that the delay clock signal is not needed to be divided, the divider 318 passes the delayed clock signal to the delay model 319 not dividing the delayed clock signal.

The delay model 319 delays a divided clock signal outputted from the divider 318 for a predetermined delay time to thereby generate a feed-backed clock signal fb_clk. The phase comparator 313 compares a rising edge of the rising edge clock signal rclk with a rising edge of the feed-backed clock signal fb_clk to thereby generate a delay increment control signal UP and a delay decrement control signal DN. Herein, the phase comparator 313 activates the delay increment control signal UP when a phase of the rising edge clock signal rclk lags behind a phase of the feed-back clock signal fb_clk. On the contrary, the phase comparator 313 activates the delay decrement control signal DN when the phase of the rising edge clock signal rclk leads the phase of the feed-backed clock signal fb_clk.

Based on the delay increment control signal UP and the delay decrement control signal DN, the shift register 314 generates the delay amount control signal to thereby control a delay amount added to an input signal of the delay line unit 317.

The multiplexer controller 315 generates the selection signal based on a least significant bit (MSB) of the delay amount control signal and the delay decrement control signal DN. In case that the delay decrement control signal DN is activated when delay amount added to the input of the delay line unit 317 is minimized, the multiplexer controller 315 controls the multiplexer 316 to change a selected clock signal between the rising edge clock signal rclk and the falling edge clock signal fclk. That is, for instance, since the delay amount added to the input signal of the delay line unit 317 is minimized at an initial state, it is not possible to decrease the delay amount added to the input signal of the delay line unit 317 in response to the delay decrement control signal DN at the initial state. Accordingly, the input signal of the delay line unit 317 is required to be inverted, and thus the multiplexer 316 selects the falling edge clock signal fclk instead of the rising edge clock signal rclk. Herein, it is assumed that the rising edge clock signal rclk is initially selected by the multiplexer 316.

Meanwhile, the DLL can be modified so that the phase comparator receives the external clock signal CLK instead of the rising edge clock signal rclk.

Figure 4:
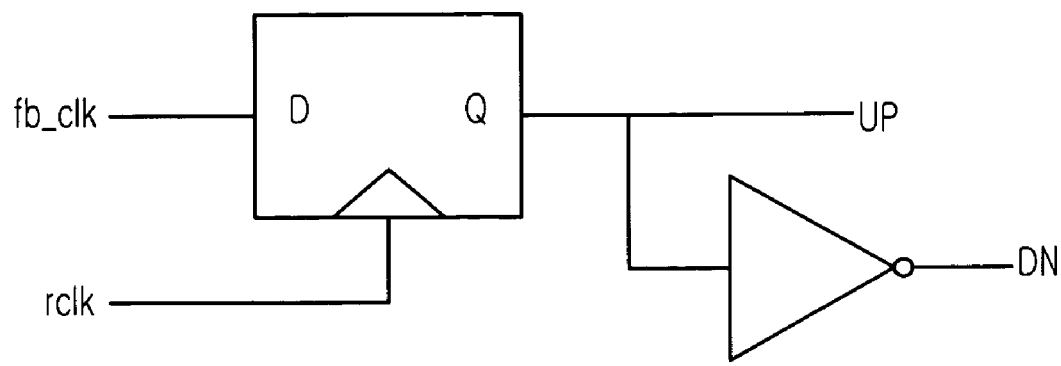
FIG. 4 is a schematic circuit diagram showing a phase comparator shown in FIG. 3.

FIG. 4 is a schematic circuit diagram showing the phase comparator 313 shown in FIG. 3.

As shown, the phase comparator 313 includes a D-type flip-flop for receiving the feed-backed clock signal fb_clk and the rising edge clock signal rclk; and an inverter for generating the delay decrement control signal DN by inverting an output of the D-type flip-flop.

Figure 5:
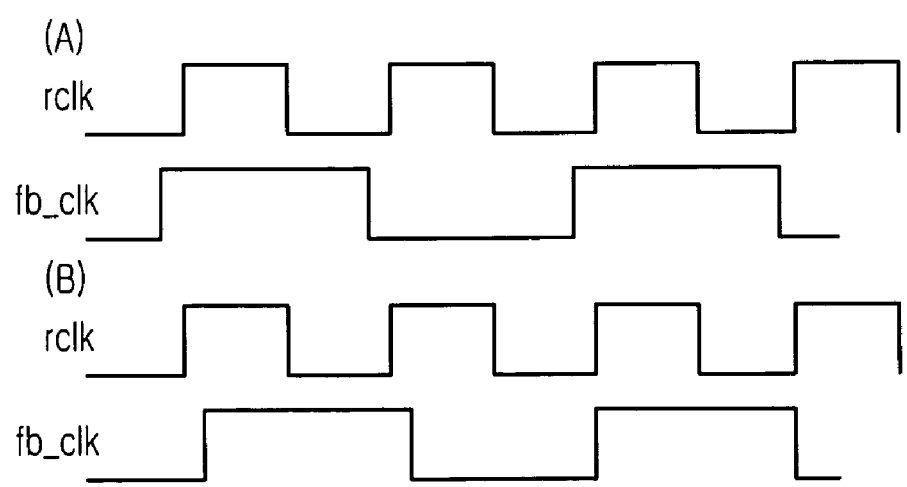
FIG. 5 is a timing diagram showing clock signals inputted to the phase comparator shown in FIG. 3.

FIG. 5 is a timing diagram showing the rising edge clock 2) signal rclk and the feed-backed clock signal fb_clk inputted to the phase comparator 313.

In case of (A), the phase of the rising edge clock signal rclk lags behind the phase of the feed-backed clock signal fb_clk. Therefore, the phase comparator 313 activates the delay increment control signal UP to thereby increase the delay amount added to the input signal of the delay line unit 317.

In case of (B), the phase of the rising edge clock signal rclk leads the phase of the feed-backed clock signal fb_clk. Therefore, the phase comparator 313 activates the delay decrement control signal DN to thereby decrease the delay amount added to the input signal of the delay line unit 317.

Figure 6:
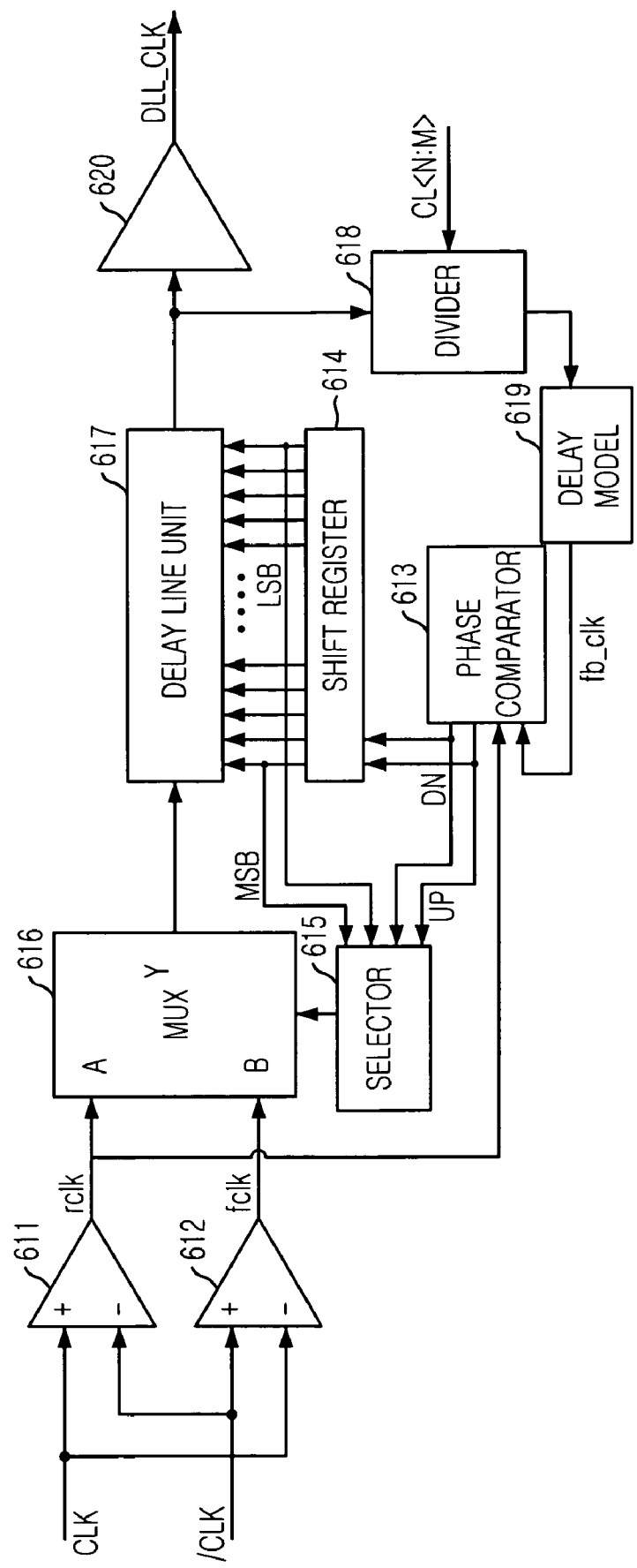
FIG. 6 is a block diagram showing a DLL in accordance with a second embodiment of the present invention.

FIG. 6 is a block diagram showing a DLL in accordance with a second embodiment of the present invention.

As shown, the DLL includes a first input buffer 611, a second input buffer 612, a multiplexer 616, a multiplexer controller 615, a delay line unit 617, a shift register 614, a phase comparator 613, a divider 618, a delay model 619 and an output buffer 620.

A structure and an operation of the DLL shown in FIG. 6 are similar to those of the DLL shown in FIG. 3. In comparison with the DLL shown in FIG. 3, the multiplexer controller 615 of the DLL shown in FIG. 6 further receives a most significant bit (MSB) of a delay amount control signal outputted from the shift register 614 and a delay increment control signal UP outputted from the phase comparator 613.

In case that the delay increment control signal UP is activated when a delay amount added to an input signal of the delay line unit 617 is maximized, it is not possible to increase the delay amount added to the input signal of the delay line unit 617. Accordingly, it is required that the input signal of the delay line unit 617 is inverted. However, the DLL shown in FIG. 3 cannot handle the above-mentioned situation. Therefore, the multiplexer 615 further receives the MSB of the delay amount control signal and the delay increment control signal UP to handle the above-mentioned situation.

As a result, the multiplexer 616 changes a selected clock signal between a rising edge clock signal rclk and a falling edge clock signal fclk in case that a delay decrement control signal DN is activated when the delay amount is minimized or in case that the delay increment control signal UP is activated when the delay amount is maximized. Further, it is possible to reduce a delay line length of the delay line unit 617 to about a half clock cycle (0.5 tCK).

Accordingly, in accordance with the present invention, a DLL can be stably operated both at a high-operational frequency and a low-operational frequency, and a delay line length can be reduced. Therefore, a size and a power consumption of the DLL can be reduced.

The present application contains subject matter related to Korean patent application No. 2004-108542, filed in the Korean Patent Office on Dec. 20, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A delay locked loop (DLL) for generating a delay locked clock signal, comprising:

a delay line unit for delaying an external clock signal according to a delay amount control signal to thereby generate the delay locked clock signal;

a divider for dividing a frequency of the delay locked clock signal in response to a column address strobe (CAS) latency and generating a divided signal; and a delay line control unit for generating the delay amount control signal based on a result of comparing a phase of the external clock signal and a delayed signal of the divided signal, wherein the divider divides the frequency of the delayed clock signal by a larger number as the CAS latency is increased.

2. The DLL as recited in claim 1, wherein the divider does not divide the delay locked clock signal when the CAS latency is lower than a predetermined value.

3. The DLL as recited in claim 1, wherein the delay line control unit includes:

a delay model for delaying the divided signal for a predetermined delay time to thereby generate the delayed signal;

a phase comparator for comparing the phase of the external clock signal and the phase of the delayed signal to thereby generate a delay increment control signal and a delay decrement control signal based on a result of the comparison; and a shift register for generating the delay amount control signal based on the delay increment control signal and the delay decrement control signal.

4. The DLL as recited in claim 3, wherein the phase comparator activates the delay increment control signal when the phase of the external clock signal lags behind the phase of the delayed signal or activates the delay decrement control signal when the phase of the external clock signal leads the phase of the delayed signal.

5. The DLL as recited in claim 3, wherein the phase comparator includes a D-type flip-flop for receiving the external clock signal and the delayed signal to thereby generate the delay increment control signal and the delay decrement control signal.

6. A delay locked loop (DLL) for use in a semiconductor memory device, comprising:

a delay line unit for delaying an external clock signal or an external clock bar signal according to a delay amount control signal to thereby generate a delay locked clock signal;

a divider for generating a divided signal by dividing a frequency of the delay locked clock signal in response to a column address strobe (CAS) latency;

a delay line control unit for generating the delay amount control signal based on a result of comparing a phase of the external clock signal and a delayed signal of the divided signal; and a multiplexing unit for inputting one of the external clock signal and the external clock bar signal to the delay line unit based on the delay amount control signal and the result of comparing, wherein the divider divides the frequency of the delayed clock signal by a larger number as the CAS latency is increased.

7. The DLL as recited in claim 6, wherein the multiplexing unit determines that a delay amount added to an input signal of the delay line unit is minimized when a least significant bit (LSB) of the delay amount control signal is activated.

8. The DLL as recited in claim 7, wherein the multiplexing unit changes the input signal of the delay line unit when the phase of the external clock signal lags behind the phase of the delayed signal and the LSB is activated.

9. The DLL as recited in claim 8, wherein the multiplexing unit determines that the delay amount added to the input signal of the delay line unit is maximized when a most significant bit (MSB) of the delay amount control signal is activated.

10. The DLL as recited in claim 9, wherein the multiplexing unit changes the input signal of the delay line unit when the phase of the external clock signal leads the phase of the delayed signal and the MSB is activated.

11. The DLL as recited in claim 10, wherein the multiplexing unit includes:

a multiplexer for selecting one of the external clock signal and the external clock bar signal according to a selection signal; and a multiplexer controller for generating the selection signal according to the delay amount control signal and the result of comparing.

12. The DLL as recited in claim 6, wherein the delay line control unit includes:

a delay model for delaying the divided signal for a predetermined delay time to thereby generate the delayed signal;

a phase comparator for comparing the phase of the external clock signal and the phase of the delayed signal to thereby generate a delay increment control signal and a delay decrement control signal based on a result of the comparison; and a shift register for generating the delay amount control signal based on the delay increment control signal and the delay decrement control signal.

13. The DLL as recited in claim 12, wherein the phase comparator activates the delay increment control signal when the phase of the external clock signal lags behind the phase of the delayed signal or activates the delay decrement control signal when the phase of the external clock signal leads the phase of the delayed signal.

14. The DLL as recited in claim 12, wherein the phase comparator includes a D-type flip-flop for receiving the external clock signal and the delayed signal to thereby generate the delay increment control signal and the delay decrement control signal.

15. A semiconductor memory device for generating a delay locked clock signal, comprising:

a buffering unit for buffering an external clock signal and an external clock bar signal to thereby generate a rising edge clock signal and a falling edge clock signal respectively;

a delay line unit for delaying the rising edge clock signal or the falling edge clock signal according to a delay amount control signal to thereby generate the delay locked clock signal;

a divider for generating a divided clock by dividing a frequency of the delay locked clock signal in response to a column address strobe (CAS) latency;

a phase comparator for comparing the phase of the rising edge clock signal and the phase of a delayed signal of the divided signal to thereby generate a delay increment control signal and a delay decrement control signal based on a result of the comparison;

a shift register for generating the delay amount control signal based on the delay increment control signal and the delay decrement control signal; and a multiplexing unit for inputting one of rising edge clock signal and the falling edge clock signal to the delay line unit based on the delay amount control signal and the result of the comparison,
wherein the divider divides the frequency of the delayed clock signal by a larger number as the CAS latency is increased.

16. The semiconductor memory device as recited in claim 15, wherein the multiplexing unit determines that a delay amount added to an input signal of the delay line unit is minimized when a least significant bit (LSB) of the delay amount control signal is activated.

17. The semiconductor memory device as recited in claim 16, wherein the multiplexing unit changes the input signal of the delay line unit when the phase of the rising edge clock signal lags behind the phase of the delayed signal and the LSB is activated.

18. The semiconductor memory device as recited in claim 17, wherein the multiplexing unit determines that the delay amount added to the input signal of the delay line unit is maximized when a most significant bit (MSB) of the delay amount control signal is activated.

19. The semiconductor memory device as recited in claim 18, wherein the multiplexing unit changes the input signal of the delay line unit when the phase of the rising edge clock signal leads the phase of the delayed signal and the MSB is activated.

20. The semiconductor memory device as recited in claim 19, wherein the multiplexing unit includes:
a multiplexer for selecting one of the rising edge clock signal and the falling edge clock signal according to a selection signal; and
a multiplexer controller for generating the selection signal according to the delay amount control signal and the result of the comparison.

21. A clock locking method of a delay locked loop (DLL) for a clock locking operation, comprising:
delaying an input clock signal according to a delay amount control signal to thereby generate a delay locked clock signal;
generating a divided clock by dividing a frequency of the delay locked clock signal, in response to a column address strobe (CAS) latency; and
generating the delay amount control signal based on a result of comparing a phase of the input clock signal and a delayed signal of the divided signals,
wherein the frequency of the delayed clock signal is divided by a larger number as the CAS latency is increased.

22. The clock locking method as recited in claim 21, wherein the
delaying of the input clock signal includes:
selecting one of an external clock signal and an external clock bar signal according to the delay amount control signal and the result of comparing; and
outputting the selected one as the input clock signal.

23. The clock locking method as recited in claim 22, wherein the generating of the delay amount control signal includes:
delaying the divided signal for a predetermined delay time to thereby generate the delayed signal;
comparing the phase of the input clock signal and the phase of the delayed signal to thereby generate a delay increment control signal and a delay decrement control signal; and
generating the delay amount control signal based on the delay increment control signal and the delay decrement control signal.

* * * * *